United States Patent
Yamazaki

(10) Patent No.: US 10,148,297 B2
(45) Date of Patent: Dec. 4, 2018

(54) SPLITTER

(71) Applicant: Murata Manufacturing Co., Ltd., Nagaokakyo-shi, Kyoto-fu (JP)

(72) Inventor: Sunao Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 615 days.

(21) Appl. No.: 14/135,908

(22) Filed: Dec. 20, 2013

(65) Prior Publication Data

US 2014/0113580 A1 Apr. 24, 2014

Related U.S. Application Data

(63) Continuation of application No. PCT/JP2012/056289, filed on Mar. 12, 2012.

(30) Foreign Application Priority Data

Jun. 23, 2011 (JP) .................................. 2011-139508

(51) Int. Cl.
*H04B 1/10* (2006.01)
*H03H 9/64* (2006.01)
*H03H 9/72* (2006.01)

(52) U.S. Cl.
CPC ......... *H04B 1/1036* (2013.01); *H03H 9/6483* (2013.01); *H03H 9/725* (2013.01)

(58) Field of Classification Search
CPC ..... H04W 88/06; H04W 48/18; H04W 88/02; H04B 1/406; H04B 1/005; H04B 1/006;
(Continued)

(56) References Cited

U.S. PATENT DOCUMENTS 6,035,213 A * 3/2000 Tokuda ............... H04B 1/1036 370/441
8,792,833 B2 * 7/2014 Tobia .................. H04B 1/1036 455/63.1
(Continued)

FOREIGN PATENT DOCUMENTS

DE 10 2004 052 210 A1 6/2005
EP EP 1231713 A2 * 8/2002 ........... H03H 9/6433
(Continued)

OTHER PUBLICATIONS

Official Communication issued in corresponding German Patent Application No. 11 2012 004 2298, dated Sep. 11, 2014.
(Continued)

*Primary Examiner* — Lana N Le
(74) *Attorney, Agent, or Firm* — Keating & Bennett, LLP

(57) ABSTRACT

In a splitter, a first band pass filter is connected between an antenna terminal and a first terminal, a high pass filter and a second band pass filter are connected between the antenna terminal and a second terminal, a pass band of the second band pass filter is higher than a pass band of the first band pass filter, a cut off frequency of the high pass filter is located closer to the high-frequency side than the pass band of the first band pass filter, the pass band of the second band pass filter is located closer to the high-frequency side than the cut off frequency, and the high pass filter also functions as a notch filter having an anti-resonant frequency in a transition region such that the steepness of the transition region between the pass band of the second band pass filter and the attenuated band is high.

19 Claims, 3 Drawing Sheets

(58) Field of Classification Search
CPC ...... H04B 1/0057; H04B 1/1036; H04B 1/02; H03H 9/6483; H03H 9/725
See application file for complete search history.

(56) References Cited

U.S. PATENT DOCUMENTS

| | | | |
|---|---|---|---|
| 2002/0057751 A1* | 5/2002 | Jagger | H04B 1/1036 375/346 |
| 2005/0099244 A1* | 5/2005 | Nakamura | H03H 9/02118 333/133 |
| 2005/0281210 A1 | 12/2005 | Makino | |
| 2007/0190954 A1 | 8/2007 | Murakami et al. | |
| 2011/0090026 A1 | 4/2011 | Nakahashi et al. | |
| 2012/0302188 A1* | 11/2012 | Sahota | H04B 1/006 455/150.1 |
| 2015/0312785 A1* | 10/2015 | Jagger | H04B 1/1036 370/252 |
| 2017/0134005 A1* | 5/2017 | Takeuchi | H03H 9/542 |

FOREIGN PATENT DOCUMENTS

| | | | |
|---|---|---|---|
| JP | 2006-108734 A | | 4/2006 |
| JP | WO2007/023643 | * | 12/2009 |
| JP | 2010-141859 | * | 6/2010 |
| JP | 2010-141859 A | | 6/2010 |
| WO | 2005/088833 A1 | | 9/2005 |
| WO | 2007/023643 A1 | | 3/2007 |

OTHER PUBLICATIONS

Official Communication issued in corresponding Japanese Patent Application No. 2013-521489, dated Aug. 19, 2014.
Official Communication issued in International Patent Application No. PCT/JP2012/056289, dated May 22, 2012.

* cited by examiner

SPLITTER

BACKGROUND OF THE INVENTION

1. Field of the Invention

The present invention relates to splitters that preferably are, for example, used in cellular phones and more specifically relates to splitters in which a first band pass filter is connected to an antenna terminal and a second band pass filter is connected to the antenna terminal and has a pass band in a higher frequency range than the first band pass filter.

2. Description of the Related Art

In recent years, in cellular phones, signals have been transmitted and received using many communication schemes. Consequently, a splitter is connected to an antenna terminal.

For example, a splitter, which is illustrated in FIG. 5, is disclosed in International Publication No. WO 2005/088833. A splitter 1001 has an antenna terminal 1002. A band pass filter 1004, which has a relatively low pass band, is connected to the antenna terminal 1002 via a matching circuit 1003. The band pass filter 1004 is formed of a surface acoustic wave filter and an output terminal thereof is connected to a first terminal 1005.

A high pass filter 1006 is connected to the antenna terminal 1002 and an output terminal of the high pass filter 1006 is connected to a second terminal 1007. The cut off frequency of the high pass filter 1006 is located further toward the high frequency side than the pass band of the band pass filter 1004.

On the other hand, a high-frequency module that is equipped with a GPS reception filter and two band pass filters, which respectively receive two cellular bands, is disclosed in Japanese Unexamined Patent Application Publication No. 2006-108734. Here, the GPS reception filter and the two band pass filters are configured so as to be capable of being switched between using a switch.

In recent years, communication schemes employing various frequencies have been used together in cellular phones and so forth. In addition, for example, a GPS function has also been provided. For GPS and GLONASS, the transmission frequency band is 1.5 GHz to 1.6 GHz. In contrast, the transmission frequency band of WLAN is around 2.4 GHz according to IEEE802.11b and so forth. Therefore, for example, in the splitter 1001 illustrated in FIG. 5, a GPS signal can be received using the pass band of the band pass filter 1004 and a WLAN signal can be received with the high pass filter 1006.

However, the Band 7 transmission frequency band is located close to the frequency of the WLAN transmission frequency band, which is around 2.4 GHz. The Band 7 transmission frequency band is around 2.5 GHz to 2.6 GHz. Therefore, it is not possible to separate a WLAN signal from a Band 7 signal with the high pass filter 1006.

Therefore, for this purpose, it is necessary to connect a band pass filter 1008, whose pass band includes the WLAN transmission frequencies and is represented by the broken line in FIG. 5, downstream of the high pass filter 1006.

Moreover, even if such a band pass filter 1008 is connected, it is difficult to attain high steepness in an attenuated region adjacent to the WLAN pass band. The Band 7 transmission frequency band is very close to the WLAN transmission frequency band as described above. Therefore, in order to attain high steepness for an attenuated region at frequencies higher than the WLAN pass band, it has been necessary to further connect a band stop filter, which attenuates a signal of the Band 7 pass band, in addition to the band pass filter 1008. Therefore, there has been a problem in that the number of components and the cost are increased.

On the other hand, as described in Japanese Unexamined Patent Application Publication No. 2006-108734, connecting band pass filters for respective bands to an antenna terminal and switching between the filters using a switch has also been considered in order allow use of multiple bands. However, since a switch is necessary, increases in size and cost are incurred.

SUMMARY OF THE INVENTION

Preferred embodiments of the present invention provide a splitter that is provided at a low cost without having an increased number of components and that is capable of effectively attaining high steepness of a filter characteristic in an attenuated region adjacent to the pass band of a band pass filter connected to an antenna terminal.

A splitter according to a preferred embodiment of the present invention includes an antenna terminal and first and second terminals. The splitter includes a first band pass filter and a high pass filter. An input terminal of the first band pass filter is connected to the antenna terminal and an output terminal of the first band pass filter is connected to the first terminal. The first band pass filter includes a first pass band, which is relatively low.

The high pass filter includes an input terminal and an output terminal and the input terminal is connected to the antenna terminal. The high pass filter includes a second pass band that is located at higher frequencies than the first pass band.

In addition, in a preferred embodiment of the present invention, the high pass filter functions as a notch filter that forms a stop band in the second pass band.

In a certain specific aspect of a splitter according to a preferred embodiment of the present invention, the high pass filter includes at least one elastic wave resonator provided in a series arm that links the input terminal and the output terminal of the high pass filter, and at least one inductance element provided in a parallel arm that links the series arm and a ground potential. A filter characteristic of the high pass filter is obtained from a capacitance component of the elastic wave resonator and an inductance of the inductance element. In addition, a characteristic of the notch filter is obtained from an anti-resonant frequency of the elastic wave resonator. Thus, a trap, that is, a stop band, is included in the frequency characteristic. In this case, the steepness of an attenuated region of the second band pass filter is more effectively made high with a small number of components.

In another specific aspect of a splitter according to a preferred embodiment of the present invention, the high pass filter includes first and second elastic wave resonators that are arranged in the series arm and the inductance element that is connected in the parallel arm that links a connection point between the first and second elastic wave resonators, and a ground potential.

In addition, in another specific aspect of a splitter according to a preferred embodiment of the present invention, the high pass filter includes first and second elastic wave resonators arranged in the series arm, a first inductance element arranged in a first parallel arm that is connected between the input terminal and a ground potential, and a second inductance element arranged in a second parallel arm connected between the output terminal and the ground potential. In this case, impedance matching is easily obtained by the inductance elements arranged in the parallel arms. In addition, a surge withstand voltage characteristic is also made high.

In yet another specific aspect of a splitter according to a preferred embodiment of the present invention, a second band pass filter is additionally provided that is connected between an output terminal of the high pass filter and the second terminal, and that has a third pass band located inside the second pass band of the high pass filter and close to the stop band. In this case, steepness of the filter characteristic in the vicinity of the third pass band is effectively made high. Therefore, selectivity for a signal inside the third pass band is made high.

In yet another specific aspect of a splitter according to a preferred embodiment of the present invention, the first pass band of the first band pass filter includes a transmission frequency of GPS or GLONASS, and the third pass band of the second band pass filter includes a 2.4 GHz band WLAN transmission frequency and the stop band is a Band 7 or Band 40 UMTS transmission frequency band. In this case, steepness in the vicinity of the WLAN pass band is effectively made high in a configuration including the first band pass filter corresponding to GPS or GLONASS and the second band pass filter corresponding to WLAN. Therefore, the influence of Band 7 or Band 40 is prevented or significantly reduced and selectivity for a WLAN signal is made high.

In a splitter according to various preferred embodiments of the present invention, the high pass filter also functions as a notch filter and therefore a wanted signal is extracted while interference from an unwanted signal is prevented or significantly reduced. Moreover, an increase in the number of components is prevented due to the high pass filter also functioning as a notch filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
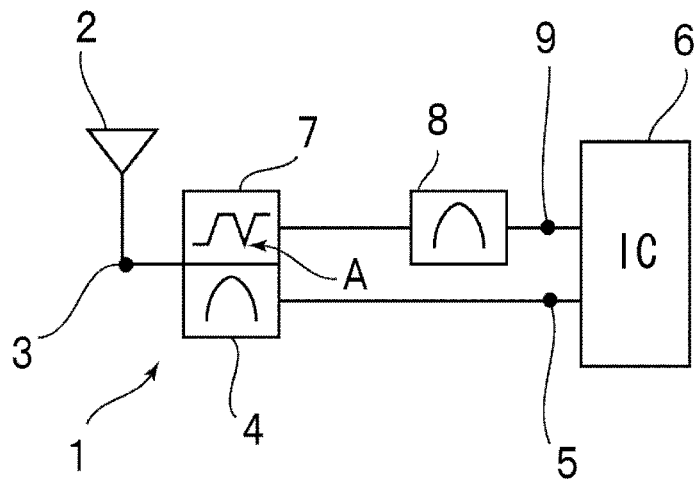
FIG. 1 is an outline structural diagram for explaining a splitter according to a first preferred embodiment of the present invention.

Hereafter, the present invention will be made clearer by describing specific preferred embodiments of the present invention while referring to the drawings.

FIG. 1 is an outline structural diagram for explaining a splitter according to a first preferred embodiment of the present invention. A splitter 1 includes an antenna terminal 3 that is connected to an antenna of a cellular phone. The splitter 1 extracts a GPS signal and a WLAN signal. In the splitter 1, the GPS pass band preferably is around 1.5 GHz to 1.6 GHz, for example. On the other hand, the WLAN pass band preferably is around 2.4 GHz in IEEE802.11b, IEEE802.11g and IEEE802.11n. Incidentally, the UMTS Band 7 transmission frequency band is close to the high-frequency side of the 2.4 GHz band WLAN pass band. The Band 7 transmission frequency band is 2.5 GHz to 2.69 GHz. Therefore, it is necessary that a Band 7 signal be sufficiently attenuated on the on the side where a WLAN signal is to be extracted.

The splitter 1 includes a first band pass filter 4. An input terminal of the first band pass filter 4 is connected to the antenna terminal 3. The first band pass filter 4 is provided to extract a GPS signal. An output terminal of the first band pass filter 4 is connected to a first terminal 5. A GPS signal is extracted from the first terminal 5 and supplied to an RF-IC 6 connected downstream of the first terminal 5.

On the other hand, the splitter 1 also includes a high pass filter 7. An input terminal of the high pass filter 7 is connected to the antenna terminal 3. The high pass filter 7 is provided to remove a GPS signal. Therefore, a cut-off frequency of the high pass filter 7 is located further toward the high-frequency side than the pass band of the first band pass filter 4.

In addition, in this preferred embodiment, the high pass filter 7 also functions as a notch filter that provides or defines a trap schematically represented by arrow A in FIG. 1 in a frequency range higher than its cutoff frequency, that is, within the pass band of the high pass filter 7.

An output terminal of the high pass filter 7 is connected to an input terminal of a second band pass filter 8. The second band pass filter 8 is a band pass filter that extracts a WLAN signal. The pass band of the second band pass filter 8 is a 2.4 GHz band in order to extract a WLAN signal. An output terminal of the second band pass filter 8 is connected to a second terminal 9. A WLAN signal is extracted from the second terminal 9 and supplied to the RF-IC 6 connected downstream of the second terminal 9.

As described above, the WLAN pass band of the splitter 1 and the Band 7 transmission frequency band are very close to each other. Therefore, in order to avoid interference between a WLAN signal and a Band 7 signal, it is necessary that attenuation of the Band 7 transmission frequency band be sufficiently large. In this preferred embodiment, a configuration is adopted in which the high pass filter 7 includes a notch filter unit in order that a Band 7 signal can be sufficiently attenuated and that steepness of the filter characteristic at the high frequency side of the WLAN pass band can be effectively made high. This will be explained in more detail with reference to the specific circuit diagram of FIG. 2.

Figure 2:
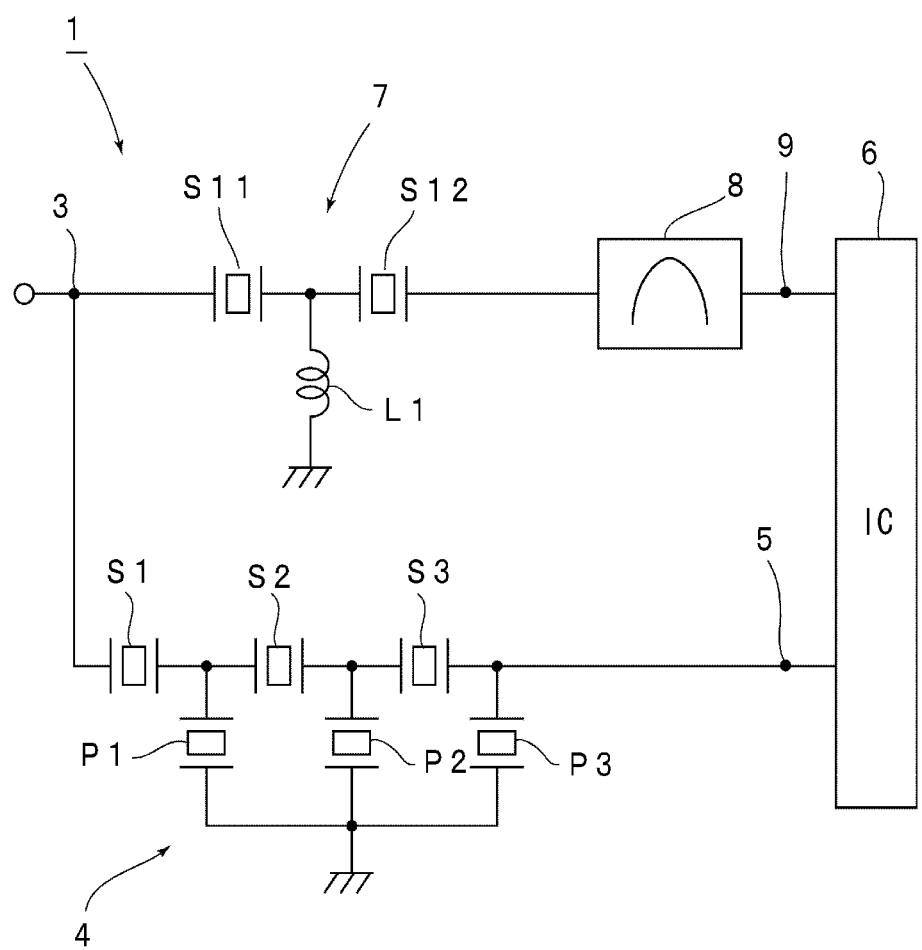
FIG. 2 is a circuit diagram for the splitter according to the first preferred embodiment of the present invention.

FIG. 2 illustrates a circuit diagram of the splitter 1. The first band pass filter 4 is a band pass filter having a ladder circuit configuration as illustrated in the figure. The first band pass filter 4 includes a plurality of series arm resonators S1 to S3 that are connected in series with each other in a series arm that links an input terminal and an output terminal of the first band pass filter 4. A first parallel arm resonator P1 is arranged in a parallel arm that links a connection point between the series arm resonators S1 and S2, and a ground potential. A parallel arm resonator P2 is arranged in a parallel arm that links a connection point between the series arm resonators S2 and S3 and the ground potential. A parallel arm resonator P3 is arranged in a parallel arm that links the output terminal and the ground potential. The series arm resonators S1 to S3 and the parallel arm resonators P1 to P3 each preferably defined by a surface acoustic wave resonator. However, the first band pass filter 4 is not limited to being defined by surface acoustic wave resonators and may instead include another type of elastic wave resonator such as boundary acoustic wave resonators or piezoelectric thin film resonators. In addition, the first band pass filter 4 is not limited to being a ladder filter so long as it is a band pass filter that allows a GPS signal to pass therethrough.

On the other hand, the high pass filter 7 includes first and second series arm resonators S11 and S12, which are connected in series with each other in a series arm that links an input terminal and an output terminal of the high pass filter 7, and an inductance element L1, which is arranged in a parallel arm that links a connection point between the series arm resonators S11 and S12 and the ground potential. The first and second series arm resonators S11 and S12 are each preferably defined by a surface acoustic wave resonator. However, the first and second series arm resonators S11 and S12 are not limited to being surface acoustic wave resonators and may be another type of elastic wave resonator such as boundary acoustic wave resonators or piezoelectric thin film resonators.

The series arm resonators S11 and S12 merely act as capacitances at frequencies other than in the ranges between their resonant frequencies and anti-resonant frequencies. Consequently, in the high pass filter 7, the characteristics of a high pass filter are obtained from the capacitance components of the series arm resonators S11 and S12 and the inductance of the inductance element L1. That is, a signal of a band extending up to the cut off frequency is attenuated and a signal of a band greater than the cut off frequency is allowed to pass. This cut off frequency is located further toward the high frequency side than the pass band of the first band pass filter 4, that is, further toward the high frequency side than the GPS pass band and is located further toward the lower frequency side than the WLAN pass band. Therefore, a GPS signal is sufficiently attenuated by the high pass filter 7 and a WLAN signal is allowed to pass therethrough.

In addition, the high pass filter 7 also defines or provides a notch filter unit using the series arm resonators S11 and S12, which are defined by surface acoustic wave resonators. This notch filter unit operates as a band elimination filter (BEF) and defines or provides a stop band inside the pass band of the high pass filter 7. In the high pass filter 7 illustrated in FIG. 1, formation of the stop band inside the pass band is illustrated schematically.

Figure 3:
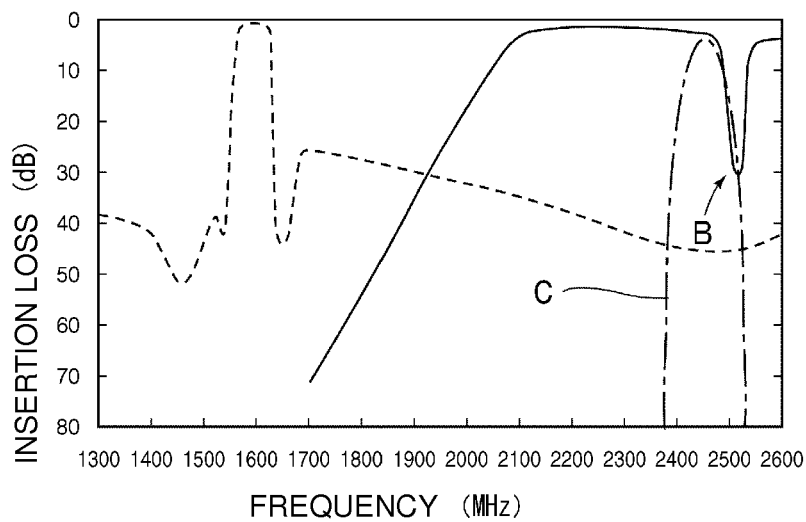
FIG. 3 illustrates an attenuation-frequency characteristic of a first band pass filter, an attenuation-frequency characteristic of a high pass filter, and a frequency characteristic of a second band pass filter of the splitter of the first preferred embodiment of the present invention.

The stop band is defined by the high impedances of the series arm resonators S11 and S12 at their anti-resonant frequencies. In this preferred embodiment, the anti-resonant frequencies of the series arm resonators S11 and S12 preferably are located in the Band 7 pass band, that is, in the vicinity of the high frequency side of the WLAN pass band. This will be described with reference to FIG. 3. The dashed line in FIG. 3 represents the filter characteristic of the first band pass filter 4 described above. In the first band pass filter 4, the insertion loss in the 1.55 GHz to 1.65 GHz band, which is the GPS pass band, is approximately 1 dB. Frequency ranges that are higher than and lower than this pass band are attenuated bands.

On the other hand, the solid line in FIG. 3 represents the filter characteristic of the high pass filter 7. The cut off frequency of the high pass filter 7 is in a higher frequency range than the GPS transmission frequency band. That is, the pass band of the high pass filter 7 is in a higher frequency range than the pass band of the first band pass filter 4. Therefore, a GPS signal is sufficiently attenuated. As described above, in this preferred embodiment, the high pass filter 7 includes a notch filter unit that operates as a band elimination filter and therefore a stop band indicated by arrow B is provided. That is, the anti-resonant frequencies of the series arm resonators S11 and S12 are located in the vicinity of 2.5 GHz, which is included in the Band 7 transmission frequency band. Therefore, a stop band indicated by the arrow B is located in the vicinity of 2.5 GHz.

Returning to FIG. 2, the second band pass filter 8, which is connected downstream of the high pass filter 7, is a band pass filter that allows a WLAN signal to pass therethrough. The band pass filter 8 is preferably defined by a suitable filter such as a ladder filter including a plurality of resonators or an LC filter including a capacitance and an inductance. In this preferred embodiment, the second band pass filter 8 is preferably defined by a ladder filter including a plurality of surface acoustic wave resonators, similarly to the first band pass filter 4.

The filter characteristic of the second band pass filter 8 is represented by the dot and dash line C in FIG. 3.

As described above, the high frequency side of the WLAN pass band and the low frequency side of the Band 7 transmission frequency band preferably are very close to each other. Therefore, the stop band B is located in a transition region where the attenuation rapidly changes between the high-frequency end of the WLAN pass band and the attenuated band.

Consequently, in this preferred embodiment, for a signal extracted from the second terminal 9, the steepness of the filter characteristic at the high-frequency end of the WLAN pass band is effectively made high. That is, it is possible to make selectivity high for a WLAN signal while suppressing a Band 7 signal.

Moreover, the high pass filter 7 is configured so as to include a notch filter unit that defines or provides a stop band using elastic wave resonators having very sharp anti-resonant and resonant frequencies and therefore an additional component or circuit for increasing the steepness of the filter characteristic is not needed. For example, in the splitter described in International Publication No. WO 2005/088833, in order to sufficiently suppress a Band 7 signal at the high-frequency side of the WLAN pass band, it was necessary to add a band stop filter as a separate circuit element as described above.

In contrast, in this preferred embodiment, the high pass filter 7 can define the stop band by utilizing the high impedances of the series arm resonators S11 and S12 at their anti-resonant frequencies in the configuration including the first and second series arm resonators S11 and S12 and the inductance element L1. In addition, if the same type of elastic wave resonator is used for the first and second series arm resonators S11 and S12 of the high pass filter 7 and the series arm resonators S1 to S3 and the parallel arm resonators P1 to P3 of the first band pass filter 4, they can be located on the same substrate. In addition, in the case where the second band pass filter 8 is defined by a ladder filter including the same type of elastic wave resonator, the second band pass filter 8 is also located on the same substrate. Therefore, selectivity for a signal in the WLAN pass band is made high at a low cost without an increase in the number of components.

Figure 4:
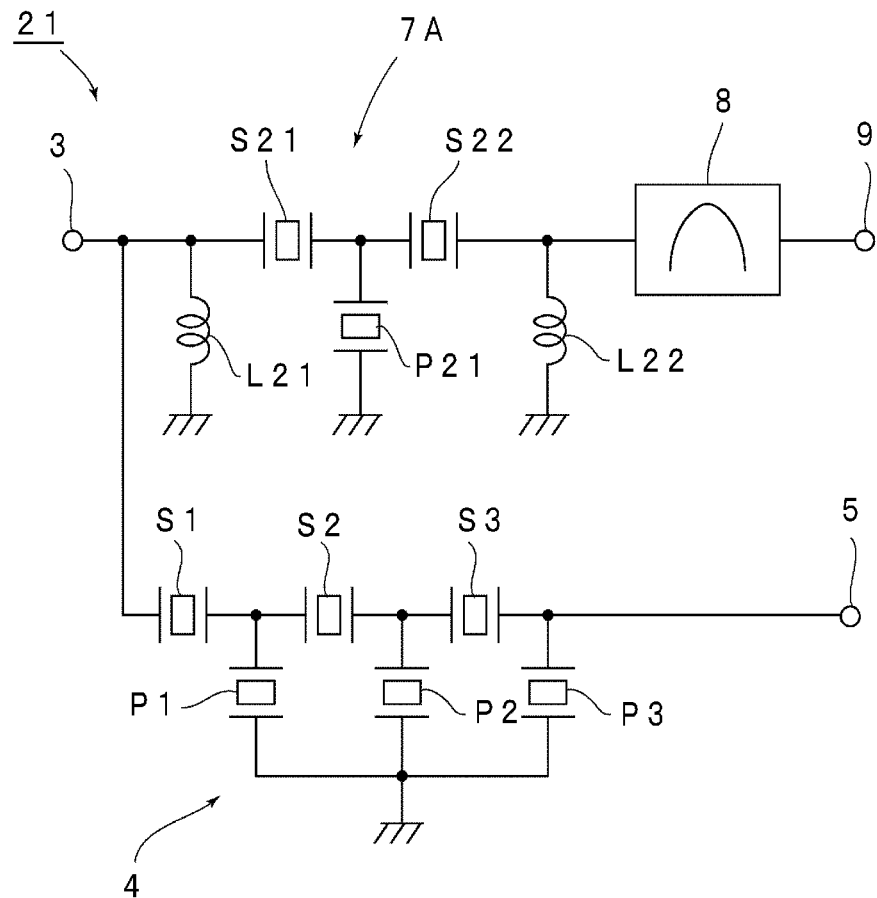
FIG. 4 is a circuit diagram for a splitter according to a second preferred embodiment of the present invention.
Figure 5:
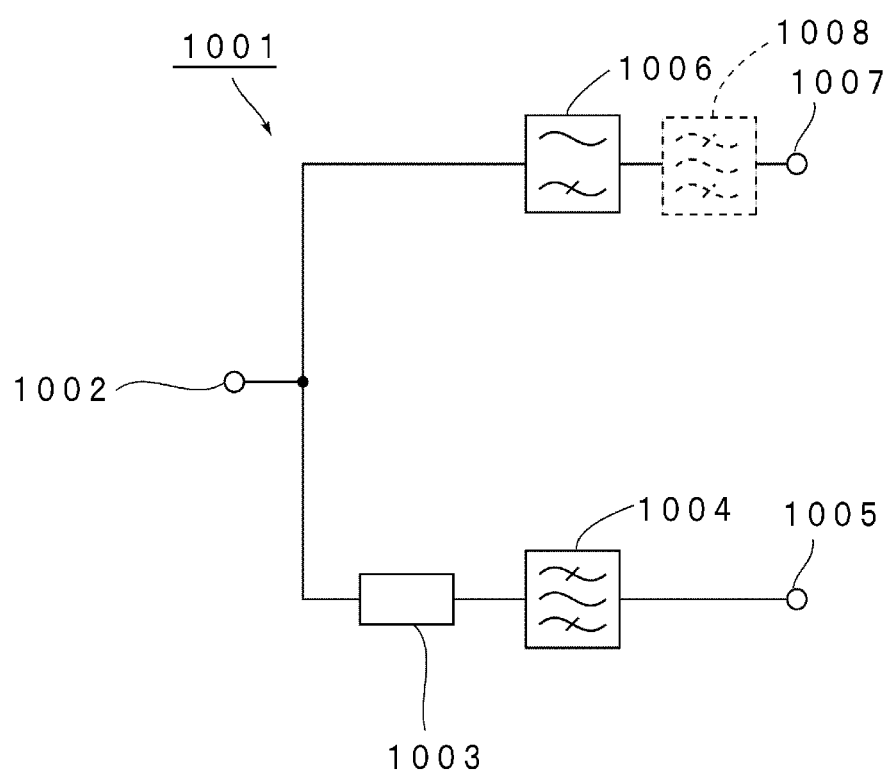
FIG. 5 is a circuit diagram illustrating an example of a splitter of the related art.

FIG. 4 is a circuit diagram for a splitter according to a second preferred embodiment of the present invention. In a splitter 21 of the second preferred embodiment, a first band pass filter 4 is connected to the antenna terminal 3. The first band pass filter 4 is preferably the same as that of the first preferred embodiment and therefore the same elements will be denoted by the same reference symbols so that description thereof may be omitted.

A high pass filter 7A and a second band pass filter 8 are connected in series with each other between the antenna terminal 3 and the second terminal 9. That is, the high pass filter 7A is connected on the antenna terminal 3 side. The second band pass filter 8 preferably has the same configuration as that of the first preferred embodiment.

This preferred embodiment differs from the first preferred embodiment in that the high pass filter 7A has the illustrated circuit configuration. That is, the high pass filter 7A includes first and second series arm resonators S21 and S22 that are connected in series with each other in a series arm that links an input terminal and an output terminal of the high pass filter 7A. The high pass filter 7A also includes a first inductance element L21 in a parallel arm that links the input terminal and the ground potential. The high pass filter 7A also includes a parallel arm resonator P21 in a parallel arm that links a connection point between the series arm resonators S21 and S22, and the ground potential. A second inductance element L22 is arranged in a parallel arm that links the output terminal and the ground potential.

Therefore, the high pass filter 7A also includes a ladder circuit configuration including a series arm and parallel arms. The series arm resonators S21 and S22 and the parallel arm resonator P21 are preferably defined by surface acoustic wave resonators. However, also in this preferred embodiment, the series arm resonator S21, S22 and the parallel arm resonator P21 may preferably be defined by an elastic wave resonator other than a surface acoustic wave resonator.

Also in the high pass filter 7A of this preferred embodiment, the characteristic of a high pass filter that allows a WLAN signal to pass therethrough is obtained from the inductance elements L21 and L22 and the capacitance components of the series arm resonators S21 and S22. Here, in the high pass filter 7A of this preferred embodiment, attenuation is gently increased on the high-frequency side of the WLAN pass band by the capacitance component of the parallel arm resonator P21. Consequently, the high pass filter 7A can also be called a band pass filter. However, the high pass filter of the present invention is not limited to being a high pass filter in the narrow sense, but rather is a band filter having a function of attenuating a signal of a band extending up to the cut off frequency and allowing a signal of a band greater than the cut off frequency to pass therethrough. Therefore, the high pass filter of various preferred embodiments of the present invention may be also considered to be a band pass filter.

On the other hand, the anti-resonant frequencies of the series arm resonators S21 and S22 and the resonant frequency of the parallel arm resonator P21 are located in the Band 7 transmission frequency band. Therefore, similarly to as in the first preferred embodiment, a trap is defined or provided by the series arm resonators S21 and S22 and the parallel arm resonator P21. Therefore, a signal in the Band 7 pass band is sufficiently attenuated. Therefore, for a signal extracted from the second terminal 9, the steepness of the filter characteristic at the high-frequency side of the WLAN pass band is effectively made high. Therefore, it is possible to effectively make selectivity for a signal in the WLAN pass band high.

In addition, in this preferred embodiment, the first and second inductance elements L21 and L22 are connected to the input terminal or the output terminal and in parallel with the series arm resonators S21 and S22. Therefore, impedance matching is easily realized by adjusting the inductance values of the inductance elements L21 and L22. In addition, on the input terminal side, the first inductance element L21 is connected to the ground potential and therefore a high surge withstand voltage characteristic is obtained.

In the first and second preferred embodiments, the anti-resonant frequencies of the series arm resonators or the resonant frequency of the parallel arm resonator of the high pass filter are preferably located in the Band 7 transmission frequency band. As a result, it is possible for signals in the Band 7 transmission frequency band to be sufficiently attenuated and for high steepness to be attained for the filter characteristic at the high-frequency side of the WLAN pass band. However, the present invention is not limited to this application. For example, in order to increase selectivity for a signal in the WLAN pass band, it may also be necessary to sufficiently attenuate signals of the Band 40 transmission frequency band (2.3 to 2.4 GHz). In such a case, the steepness of the filter characteristic in the vicinity of the low-frequency side of the WLAN pass band can be increased by positioning the anti-resonant frequency of an elastic wave resonator, that is, the position at which a trap is provided, inside the Band 40 transmission frequency band.

In addition, the pass band of the first band pass filter 4 is not limited to being the GPS pass band and may be the GLONASS transmission frequency band. Moreover, the pass band of the first band pass filter 4 is not limited to being the GPS or GLONASS pass band, so long as the pass band is lower than the pass band of the second band pass filter 8. That is, the splitter according to various preferred embodiments of the present invention can be applied to a wide range of applications in which there is a need to separate signals input from an antenna terminal into a first pass band, which is a relatively low frequency pass band, and a second pass band, which is a relatively high-frequency pass band. Therefore, the pass band of the first band pass filter 4 is not limited to being a GPS or GLONASS pass band. Similarly, the pass band of the second band pass filter 8 is not limited to being a WLAN pass band.

In addition, the circuit configuration of a high pass filter, which is characteristic of preferred embodiments of the present invention, is not limited to the configurations illustrated in FIG. 2 and FIG. 4, and the number of stages of the filter in the ladder circuit configuration is not particularly limited. That is, it is sufficient that the circuit configuration of the high pass filter according to various preferred embodiments of the present invention be a ladder circuit configuration including at least one elastic wave resonator provided in a series arm and at least one inductance element provided in a parallel arm.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A splitter comprising:
an antenna terminal and first and second terminals;
a first band pass filter including an input terminal that is connected to the antenna terminal, an output terminal that is connected to the first terminal, and a first pass band that is relatively low; and
a high pass filter including an input terminal and an output terminal, the input terminal of the high pass filter being connected to the antenna terminal, and including a second pass band located at higher frequencies than the first pass band; wherein
the high pass filter is a notch filter that defines a stop band inside the second pass band; and a second band pass filter is connected between the output terminal of the high pass filter and the second terminal, the second band pass filter includes a third pass band located inside the second pass band of the high pass filter, and a high frequency side of the third pass band is closer to a low frequency side of the stop band than a high frequency side of the stop band.

2. The splitter according to claim 1, wherein
the high pass filter includes at least one elastic wave resonator provided in a series arm that links the input terminal and the output terminal of the high pass filter and at least one inductance element provided in a parallel arm that links the series arm and a ground potential;
a filter characteristic of the high pass filter is obtained from a capacitance component of the elastic wave resonator and an inductance of the inductance element; and
a frequency characteristic of the notch filter is obtained from an anti-resonant frequency of the elastic wave resonator.

3. The splitter according to claim 2, wherein the high pass filter includes first and second elastic wave resonators arranged in the series arm, a first inductance element arranged in a first parallel arm that is connected between an input terminal and a ground potential, and a second inductance element arranged in a second parallel arm connected between the output terminal and the ground potential.

4. The splitter according to claim 1, wherein the first pass band of the first band pass filter includes a transmission frequency of GPS or GLONASS, and the third pass band of the second band pass filter includes a 2.4 GHz band WLAN transmission frequency and the stop band is a Band 7 or Band 40 UMTS transmission frequency band.

5. The splitter according to claim 1, wherein the splitter is configured to extract a GPS signal and a WLAN signal.

6. The splitter according to claim 1, wherein the first band pass filter has a ladder circuit configuration.

7. The splitter according to claim 1, wherein the first band pass filter includes a plurality of series arm resonators that are connected in series with each other in a series arm that links the input terminal and the output terminal.

8. The splitter according to claim 1, wherein the first band pass filter includes at least one of surface acoustic wave resonators, boundary acoustic wave resonators and piezoelectric thin film resonators.

9. The splitter according to claim 1, wherein the notch filter unit includes series arm resonators.

10. The splitter according to claim 9, wherein the series arm resonators are surface acoustic wave resonators.

11. The splitter according to claim 9, wherein the stop band is defined by impedances of the series arm resonators at anti-resonant frequencies thereof.

12. The splitter according to claim 11, wherein the anti-resonant frequencies of the series arm resonators are located in the Band 7 pass band.

13. The splitter according to claim 1, wherein the second band pass filter includes a ladder filter including a plurality of resonators or an LC filter including a capacitance and an inductance.

14. The splitter according to claim 1, wherein the high pass filter includes first and second series arm resonators that are connected in series with each other in a series arm that links the input terminal and the output terminal.

15. The splitter according to claim 14, wherein the high pass filter includes a first inductance element in a parallel arm that links the input terminal and a ground potential and a parallel arm resonator in a parallel arm that links a connection point between the first and second series arm resonators, and the ground potential.

16. The splitter according to claim 15, wherein a second inductance element is arranged in a parallel arm that links the output terminal and the ground potential.

17. The splitter according to claim 1, wherein the high pass filter includes a ladder circuit configuration including a series arm and parallel arms.

18. A cellular phone comprising:
an antenna; and
the splitter according to claim 1; wherein
the antenna terminal of the splitter is connected to the antenna.

19. A splitter comprising:
an antenna terminal and first and second terminals;
a first band pass filter including an input terminal that is connected to the antenna terminal, an output terminal that is connected to the first terminal, and a first pass band that is relatively low;
a high pass filter including an input terminal and an output terminal, the input terminal of the high pass filter being connected to the antenna terminal, and including a second pass band located at higher frequencies than the first pass band; wherein
the high pass filter is a notch filter that defines a stop band inside the second pass band;
the high pass filter includes first and second elastic wave resonators that are arranged in a series arm that links the input terminal and the output terminal of the high pass filter and an inductance element that is connected in a parallel arm that links a connection point between the first and second elastic wave resonators and a ground potential;
the inductance element is directly connected between the connection point and the ground potential; and
the input terminal and the output terminal of the high pass filter are connected to each other through only the first and second elastic wave resonators.

* * * * *